United States Patent
Takahashi et al.

(10) Patent No.: US 7,186,295 B2
(45) Date of Patent: Mar. 6, 2007

(54) QUARTZ THIN FILM

(75) Inventors: Naoyuki Takahashi, Hamamatsu (JP); Takato Nakamura, Hamamatsu (JP); Satoshi Nonaka, Hamamatsu (JP); Hiromi Yagi, Hamamatsu (JP); Yoichi Shinriki, Tokyo (JP); Katsumi Tamanuki, Kanagawa-ken (JP)

(73) Assignee: Humo Laboratory, Ltd., Tokyo (JP)

( * ) Notice: Subject to any disclaimer, the term of this patent is extended or adjusted under 35 U.S.C. 154(b) by 349 days.

(21) Appl. No.: 10/727,613

(22) Filed: Dec. 5, 2003

(65) Prior Publication Data

US 2004/0107895 A1   Jun. 10, 2004

Related U.S. Application Data

(62) Division of application No. 09/767,154, filed on Jan. 23, 2001, now Pat. No. 6,844,074.

(30) Foreign Application Priority Data

Sep. 6, 2000   (JP) .............................. 2000-270300

(51) Int. Cl.
    *C30B 25/02*   (2006.01)
(52) U.S. Cl. .......................... 117/84; 117/88; 117/935; 117/942; 117/943

(58) Field of Classification Search .................. 117/84, 117/88, 935, 942, 943
See application file for complete search history.

(56) References Cited

U.S. PATENT DOCUMENTS

| | | | | |
|---|---|---|---|---|
| 5,146,082 A | * | 9/1992 | Abe | 250/227.2 |
| 5,879,811 A | * | 3/1999 | Tanaka et al. | 428/428 |
| 5,904,770 A | * | 5/1999 | Ohtani et al. | 117/103 |
| 5,916,365 A | | 6/1999 | Sherman | |
| 5,932,281 A | | 8/1999 | Hochido et al. | |
| 6,290,735 B1 | | 9/2001 | Kambe et al. | |
| 2005/0158901 A1 | * | 7/2005 | Yamazaki et al. | 438/30 |

FOREIGN PATENT DOCUMENTS

JP   05215929 A   8/1993
JP   08110425 A   4/1996

* cited by examiner

*Primary Examiner*—Yogendra N. Gupta
*Assistant Examiner*—Matthew J. Song
(74) *Attorney, Agent, or Firm*—Venable LLP; Michael A. Sartori; Kavita B. Lepping (57) ABSTRACT

A single crystal of quartz thin film and a production method therefor are provided. A method for producing a quartz epitaxial thin film comprises the steps of vaporizing a silicon alkoxide as a silicon source under atmospheric pressure to introduce the silicon alkoxide to a substrate with hydrogen chloride as a reaction promoter, and reacting ethyl silicate with oxygen to deposit a quartz on the substrate. The single crystal of quartz thin film has excellent crystalinity, and optical properties.

9 Claims, 6 Drawing Sheets

QUARTZ THIN FILM

CROSS REFERENCE TO RELATED APPLICATION

This application is a divisional of application Ser. No. 09/767,154 filed on Jan. 23, 2001, now U.S. Pat. No. 6,844,074.

BACKGROUND OF THE INVENTION

1. Field of the Invention

The present invention relates to a quartz thin film for use in vibrators, oscillators, high frequency filter surface acoustic wave elements, optical waveguides, semiconductor substrates and the like, and to a production method therefor.

2. Description of the Related Art

Quartz thin films have been widely used for vibrators, oscillators, high frequency filter surface acoustic wave elements, optical waveguides and the like, and are very important industrial materials. Quartz thin films are produced by a method in which a single crystal of quartz obtained by a hydrothermal synthesis is polished to provide a thin film, or by a direct production method such as a sol-gel method, a plasma enhanced chemical vapor deposition (CVD) method, a sputtering method, and a laser ablation method.

Many thin film techniques for single crystals of quartz have been developed, as disclosed in Japanese Unexamined Patent Applications, Publication Nos. 8-157297, 8-225398, 8-268718, 8-91977, and 9-315897.

In these patent publications, a single crystal of quartz thin film is produced by a sol-gel method, a plasma CVD method, or a sputtering method using a silicon alkoxide as a source material. The sol-gel method requires many complex steps such as adding alcohol, water, and amine to a source solution, refluxing, coating on the substrate, drying, and heat processing. The plasma CVD method, the sputtering method, and the laser ablation method require large-scale equipment. For example, in the laser ablation method, a sintered target is irradiated with an ultraviolet laser pulse under an ultra-high vacuum to vaporize it and produce a plasma, thereby growing a thin film on a substrate. It requires a vacuum device capable of reducing pressure to an extreme degree, an eximer laser, and a sintered material. The growth rate of the quartz thin film formed on the substrate is as low as 0.25 µm/h.

In summary, the sol-gel method requires many steps and is therefore unsuitable for industrial production. The laser ablation method requires expensive equipment, such as vacuum devices, and expensive materials such as highly purified silicon dioxide as a target, and can grow a quartz thin film only at a low rate, which makes it unsuitable for industrial production.

SUMMARY OF THE INVENTION

An object of the present invention is to provide a quartz thin film for use in vibrators, oscillators, high frequency filter surface acoustic wave elements, optical waveguides, semiconductor substrates, and the like, using an atmospheric pressure vapor phase epitaxial (AP-VPE) method in which ethyl silicate is reacted with oxygen to grow a thin film epitaxially on a substrate at atmospheric pressure rather than under a vacuum.

The present inventors have discovered a method for producing a quartz thin film using the AP-VPE method in which an inexpensive silicon alkoxide is reacted with oxygen to grow a thin film epitaxially on a substrate under atmospheric pressure rather than under a vacuum.

The method for producing a quartz epitaxial thin film according to the present invention comprises the steps of vaporizing a silicon alkoxide at atmospheric pressure to introduce the silicon alkoxide on a substrate, and reacting the silicon alkoxide with oxygen to deposit a quartz on the substrate.

In the method for producing the quartz epitaxial thin film, a reaction promoter, e.g., hydrogen chloride, for promoting the reaction of the silicon alkoxide with oxygen, may be added. The substrate may have a buffer layer on which the quartz epitaxial thin film is grown.

According to the present invention, the deposition thickness of the quartz epitaxial thin film on the substrate is as high as about 3 µm per hour.

Examples of the silicon alkoxide for producing a quartz by reacting with oxygen include tetramethoxysilane, tetraethoxysilane, tetrapropoxysilane and tetrabutoxysilane. Examples of an oxygen-containing gas for producing a quartz by reacting with the silicon alkoxide include oxygen, ozone, dinitride monoxide, and water.

DESCRIPTION OF THE PREFERRED EMBODIMENTS

According to the present invention, the quartz thin film grows epitaxially by heating and vaporizing the silicon alkoxide at atmospheric pressure, which is transferred to a substrate using a carrier gas such as nitrogen and is reacted with oxygen gas on the substrate. A heating source for the silicon alkoxide is, for example, a high frequency induction heater, or a resistance heater.

The silicon alkoxide as the source material is heated and a part thereof is introduced into a growing area for growing on the substrate as a vapor phase. The amount of the silicon alkoxide introduced can be adjusted by changing a heating temperature and the amount of the carrier gas. The heating temperature ranges generally from about 50 to 120° C. in view of a vapor pressure of the silicon alkoxide.

Any inert gases can be used as the carrier gas for introducing the part of the source material into the growing area. For example, nitrogen, argon, and helium can be used as the carrier gas. Nitrogen is preferred because it is inexpensive.

The silicon material does not necessarily have a purity as high as that of a target, such as 3N and 5N, which is used in a laser ablation method. It is sufficient that it have a purity of about 99.5%. The higher the purity, the more the crystalinity and the crystal properties are enhanced.

The oxygen-containing gas for producing a quartz by reacting with the silicon alkoxide is introduced into the growing area with the carrier gas. A larger amount of the oxygen-containing gas tends to increase the growth rate of the quartz thin film and to improve the crystalinity thereof. Conversely, a smaller amount of the oxygen-containing gas tends to decrease the growth rate and to degrade the crystalinity thereof. This may be caused by a small equilibrium constant of the reaction by which the silicon alkoxide and oxygen produce the quartz. It is therefore preferred that oxygen be provided in excess relative to the silicon alkoxide. The oxygen partial pressure is generally about 0.1 to 0.3 atm, depending on the amount of the silicon alkoxide vaporized. The growth rate of the quartz increases by adding hydrogen chloride (HCL) to the reaction of the silicon alkoxide with oxygen. It is believed that hydrogen chloride functions catalytically in the reaction of the silicon alkoxide with oxygen. In this case, the oxygen partial pressure is generally about 0.001 to 0.003 atm depending on the amount of the silicon alkoxide vaporized.

Examples of the substrate for use in the present invention include a sapphire substrate, a silicon substrate, and a GaAs substrate. The substrate is heated and is maintained at a constant temperature. The substrate may be parallel to or vertical with respect to the flow of the source gas, or it may be tilted at a predetermined angle.

A quartz epitaxial thin film may be grown directly on the substrate. Alternatively, the quartz epitaxial thin film may be grown on a buffer layer formed on the substrate. This leads to improved crystalinity in the quartz epitaxial thin film.

The buffer layer can be formed by, for example, growing an amorphous crystal on the substrate at a relatively low temperature and annealing it. Alternatively, the buffer layer may be formed by pre-forming other materials such as GaN and ZnO which have a hexagonal shape similar to the quartz on the sapphire substrate. The buffer layer contributes to correcting nonconformity in the lattices.

To verify the buffer layer contribution, a quartz epitaxial thin film was formed on a sapphire substrate on which an amorphous crystal buffer layer having a thickness of 50 nm was formed, which was formed by depositing a quartz thereon at 550° C. and annealing it. A full width at half maximum (FWHM) determined by an X-ray diffraction peak was 1.0 minute. Typically, the FWHM is an index of crystalinity in the epitaxial film. Another quartz epitaxial thin film was formed on a sapphire substrate with no buffer layer. The FWHM was about 10.0 minutes. The result shows that the buffer layer contributes to enhancing crystalinity in the quartz epitaxial thin film. The smaller the FWHM, the sharper peak and the better the crystalinity.

It is believed that the crystalinity is improved because the buffer layer corrects nonconformity in lattices (1), prevents cracking caused by differential thermal expansion (2), and promotes growth in a width direction (substrate direction) in an initial growing stage (3). It is preferred that the thickness of the buffer layer be about 25 to 80 nm based on experimental results.

Figure 1:
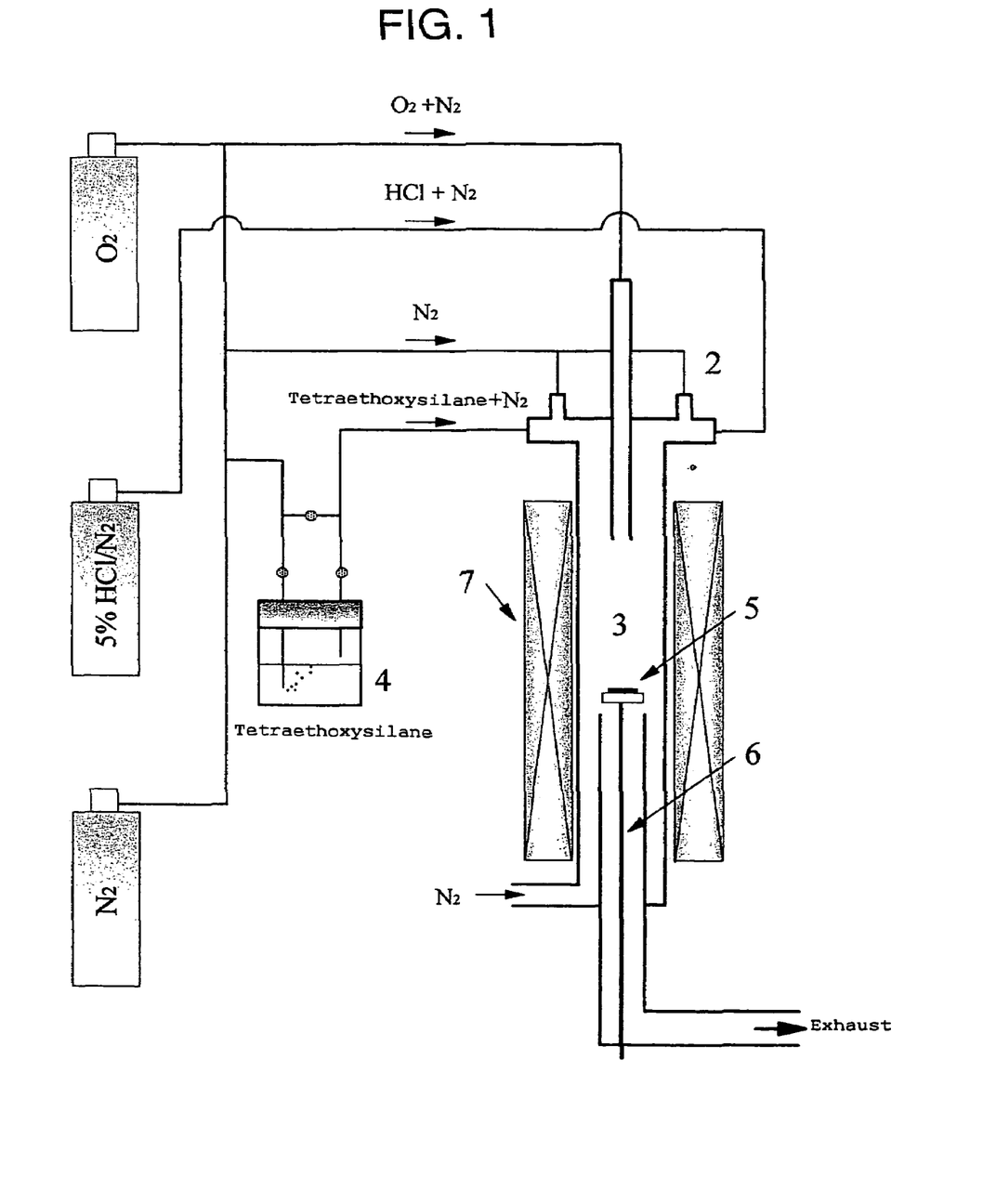
FIG. 1 is a schematic diagram of an apparatus for epitaxial growth of a quartz thin film according to the present invention.

One example of the quartz epitaxial thin film growth using nitrogen as the carrier gas according to the present invention is explained below. A vapor phase epitaxial growing device used in the present invention is a vertical quartz reactor as shown in FIG. 1. The reactor 1 comprises a source material providing portion 2 and a growing area 3, and both are maintained at a certain temperature. The source material providing portion 2 is heated to a temperature within a range of 50 to 120° C. In FIG. 1, the source material providing portion 2 is heated to 70° C. A silicon alkoxide as the silicon source material is vaporized at a bubbler (vaporizer) 4, and is transported to the growing area 3 with nitrogen provided from the left side. Together with the nitrogen, oxygen for forming a quartz and hydrogen chloride (catalyst) for promoting the reaction are introduced into the growing area 3 in the reactor at a predetermined partial pressure.

The growing area 3 is heated to a temperature within a range of 550 to 850° C. at which the quartz grows. A sapphire substrate 5 is maintained at the same temperature. Ethyl silicate is effectively reacted with oxygen by use of catalytic hydrogen chloride to produce a quartz. The quartz adsorbs, grows, and forms an epitaxial film on the sapphire (0001) substrate. The nitrogen introduced at a lower portion of the reactor is for (1) creating a convection at the growing area 3 to promote the reaction, and (2) drawing the gas toward a predetermined exhaust vent. The total pressure in the reactor is maintained at atmospheric pressure. Ethane, carbon dioxide and water that are produced upon the reaction, and unreacted tetraethoxysilane and oxygen are exhausted together with the carrier gas, nitrogen, from the exhaust vent. In FIG. 1, a rod 6 made of quartz is for mounting, inserting, and withdrawing the sapphire substrate. TABLE 1 shows typical reaction conditions. In TABLE 1, "sccm" means "standard cubic centimeter per minute".

TABLE 1

| | |
|---|---|
| Tetraethoxysilane partial pressure | $3.3 \times 10^{-3}$ atm |
| Oxygen partial pressure | $3.3 \times 10^{-1}$ atm |
| Hydrogen chloride | $1.67 \times 10^{-3}$ atm |
| Total pressure | 1 atm |
| Total flow rate | 800 sccm |
| Substrate | Sapphire (0001) |
| Growth temperature | 550 to 850° C. |

The growth rate of the epitaxial film increased as the temperature increased. The maximum growth rate was 3 μm/h. This growth rate is about 12 times higher than that, i.e., about 0.25 λm/h, in a normal laser ablation method.

The quartz epitaxial thin film thus obtained by the present invention did not contain impurities and had high crystalinity. The thin film can be used in vibrators, oscillators, high frequency filter surface acoustic wave elements, optical waveguides, semiconductor substrates, and the like.

The present invention will be illustrated by the following Examples.

EXAMPLE 1

The apparatus shown in FIG. 1 was used. Oxygen having a purity of 99.9% or more flowed at a flow rate of 200 sccm and a nitrogen gas having a purity of 99.9% or more flowed at a flow rate of 20 sccm to a source material providing portion 2. Tetraethoxysilane having a purity of 99.5% or more contained in a bubbler 4 was heated to 70° C. Nitrogen gas flowed at a flow rate of 95 sccm and hydrogen chloride gas diluted to 5% with nitrogen flowed at a flow rate of 20 sccm to the source material providing portion 2. Nitrogen gas flowed at a flow rate of 280 sccm to the source material providing portion 2. The total flow rate was adjusted to 800 sccm by adding diluted nitrogen gas. The total pressure was adjusted to 1 atm. The oxygen partial pressure was $3.3 \times 10^{-1}$ atm, and the tetraethoxysilane partial pressure was $3.3 \times 10^{-3}$ atm. A sapphire (0001) (nonconformity in lattices of 3.3%) substrate was heated to a temperature within a range of 550 to 850° C. A quartz epitaxy thin film having a thickness of 3 μm was formed thereon. The thin film thus obtained was evaluated using double crystal X-ray diffraction (DC-XRD), a scanning electron microscope (SEM), and a reflection infrared spectrometer.

Figure 2:
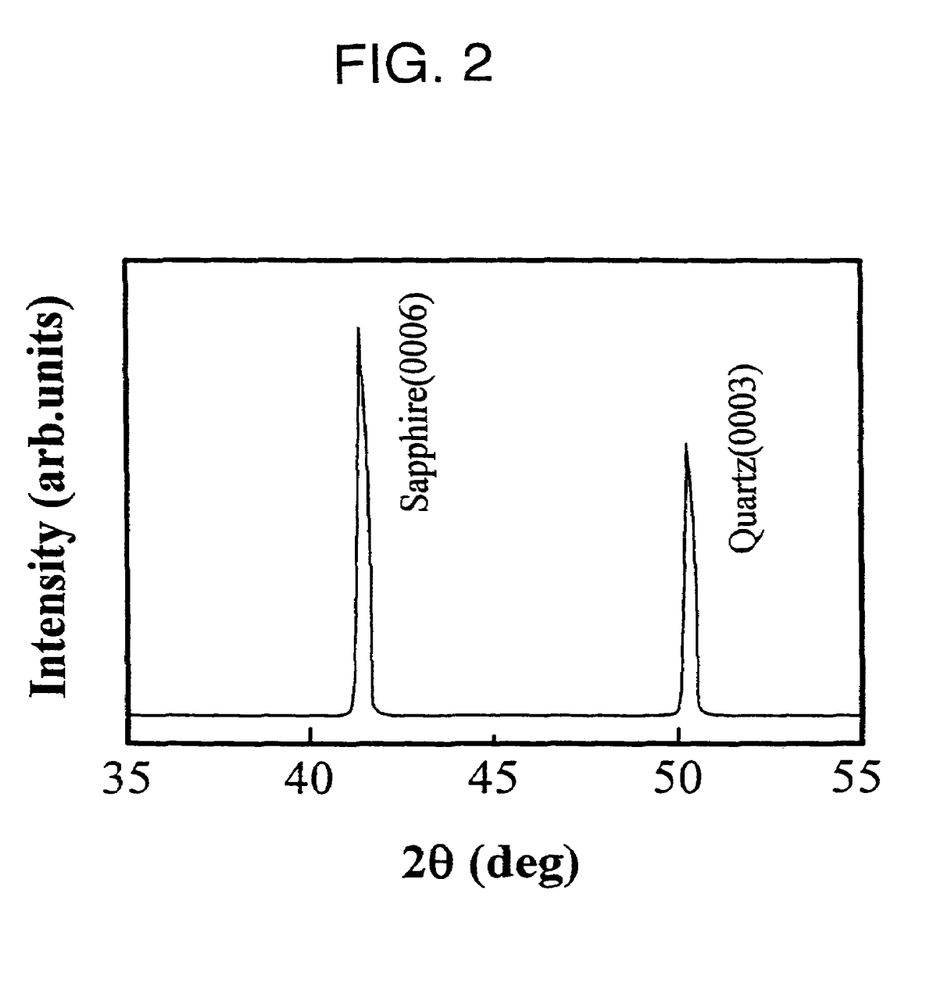
FIG. 2 is a graph showing a double crystal X-ray diffraction (DC-XRD) spectrum of a quartz epitaxial growth film made with a tetraethoxysilane-oxygen-hydrogen chloride-nitrogen system.

FIG. 2 is a graph showing an X-ray diffraction (XRD) spectrum of the quartz epitaxial film grown at 800° C. Measurement was made with "RIGAKU RINT 2000" under the conditions shown in TABLE 2 below.

TABLE 2

| X-ray | $Cu_{k\alpha 1}$ 30 kV 200 mA |
|---|---|
| Scanning axis | 2θ/θ |
| Light slit | 0.3 mm |
| Scanning range | 35 to 55° |
| Scanning speed | 1°/min |

An X-ray diffraction profile in FIG. 2 has a diffraction peak at 2θ=50.6°, which shows that the quartz epitaxial film has a hexagonal system (0003). A diffraction peak at 2θ=41.8 is a diffraction peak of the sapphire substrate (0006).

The epitaxial film grew in a specific orientation on the surface of the substrate. There is an X-ray diffraction peak representing this specific orientation. According to the present invention, a crystal having a hexagonal system grows on the sapphire substrate (0001), and it is expected to have an X-ray diffraction peak of a quartz (000x). The X-ray diffraction peak obtained represents the hexagonal system quartz phase (0003), which shows that the quartz thin film grew epitaxially in a c-axis orientation.

Figure 3:
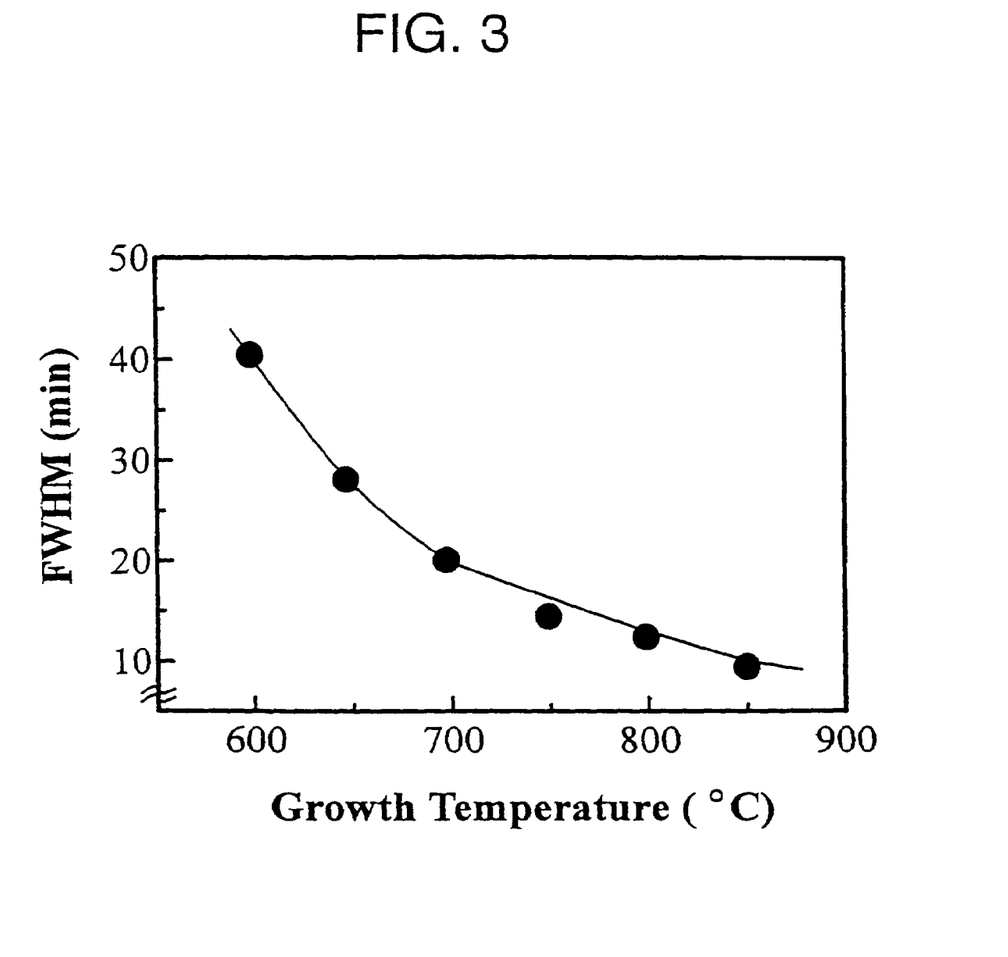
FIG. 3 is a graph showing the relationship between an epitaxial growth temperature and a full width at half maximum (FWHM).

The FWHM was determined by the double crystal X-ray diffraction peak of the quartz phase (0003) at each growth temperature. FIG. 3 is a plot of the growth temperature and the FWHM. As shown in FIG. 3, the FWHM showing crystalinity decreased as the growth temperature increased. In Example 1, the FWHM of the quartz thin film formed at 850° C. was 10.0 minutes. The quartz thin film had excellent crystalinity.

Figure 4:
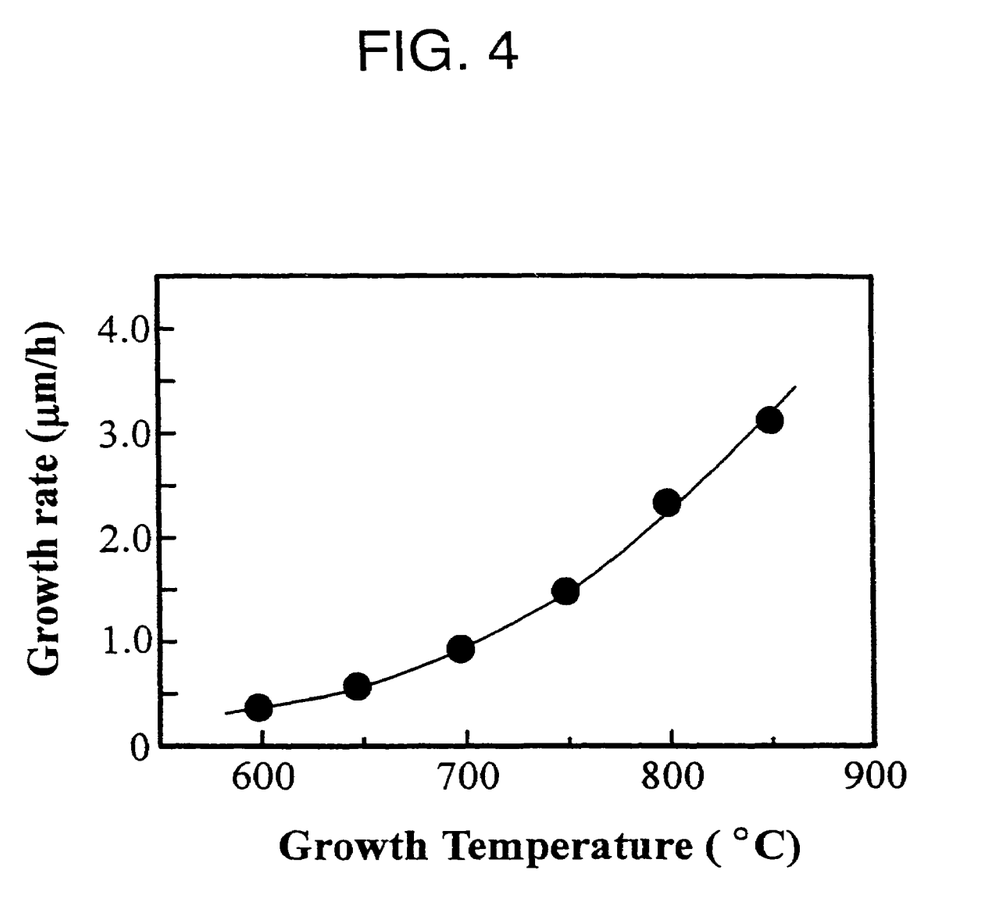
FIG. 4 is a graph showing the relationship between growing temperature and epitaxial growth rate of an epitaxial film.

The growth rate of the quartz thin film was calculated based on the film thickness on a sectional photograph of the SEM at each temperature. FIG. 4 is a plot of the growth temperature and the growth rate. Measurement was made using a "SHIMADZU SUPERSCAN-220." Growth of the quartz thin film was started at a temperature of 600° C., and the quartz thin film had a growth rate of 3.0 μm at 850° C. The inverse of the temperature and the growth rate were plotted to calculate the activation energy from the slope thereof. The activation energy was 16.7 kcal/mol. It is reported that a silicon dioxide thin film (insulation film) can generally be formed only at a high temperature of 1000° C. or more by thermal decomposition of tetraethoxysilane, or a reaction of tetraethoxysilane and oxygen. Below 1000° C., $SiO_2$ will not be deposited on the substrate. The activation energies of the thermal decomposition of tetraethoxysilane, and the reaction of tetraethoxysilane and oxygen are as high as 190 kcal/mol and 230 kcal/mol, respectively. This fact indicates that HCL works catalytically to promote the reaction of the tetraethoxysilane-oxygen-hydrogen chloride-nitrogen system in formation of the quartz thin film.

It was found that a quartz epitaxial thin film having excellent crystalinity could be obtained using the tetraethoxysilane-oxygen-hydrogen chloride-nitrogen system as the silicon source at a lower temperature than that used in a conventional method.

Figure 5:
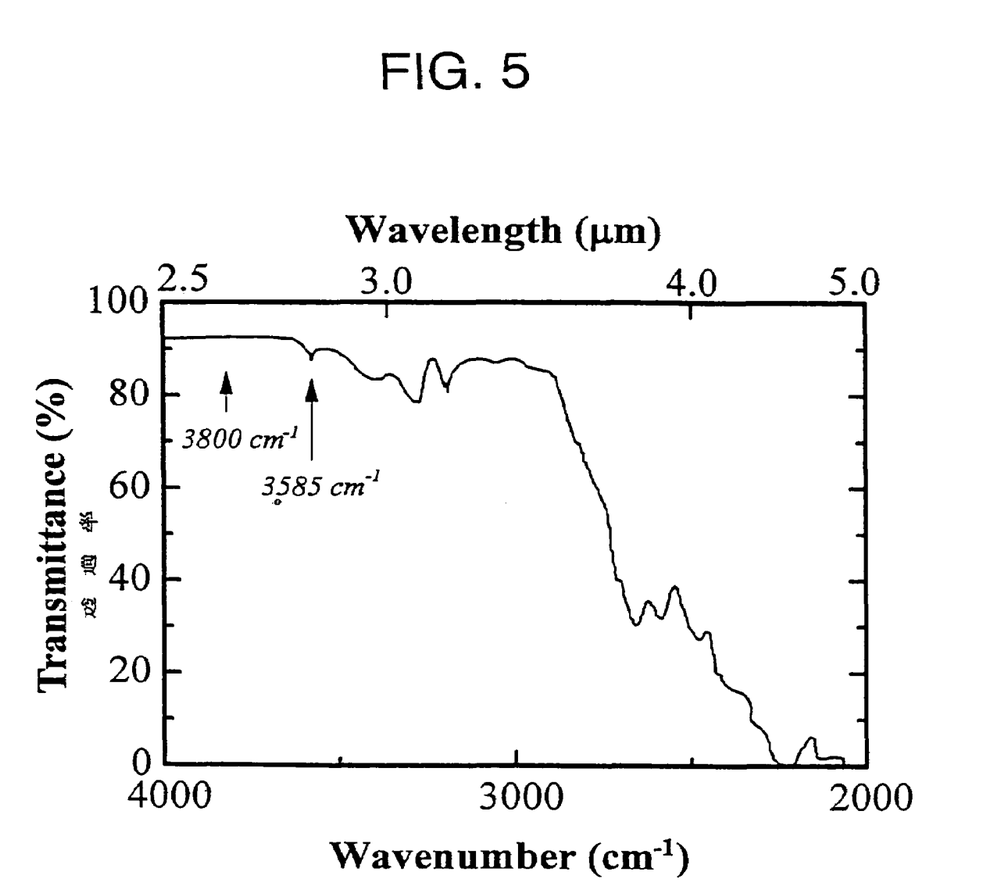
FIG. 5 is a graph showing an infrared light absorption spectrum of a quartz thin film made with tetraethoxysilane-oxygen-hydrogen chloride-nitrogen system.

Infrared rays (IR) within a range of 2000 to 4000 $cm^{-1}$ were irradiated on the quartz epitaxial thin film to measure infrared ray absorption properties. Measurement was made using a "SHIMADZU FTIR-8700." FIG. 5 shows an infrared ray absorption spectrum of the quartz thin film. The quartz thin film was absorbed at a wavenumber of 3585 $cm^{-1}$, which indicates the presence a hydroxyl group (OH group). The infrared ray absorption spectrum obtained was almost the same as that of a single crystal of quartz. As a result, a quartz epitaxial thin film having excellent crystalinity and optical properties was obtained.

EXAMPLE 2

Figure 6:
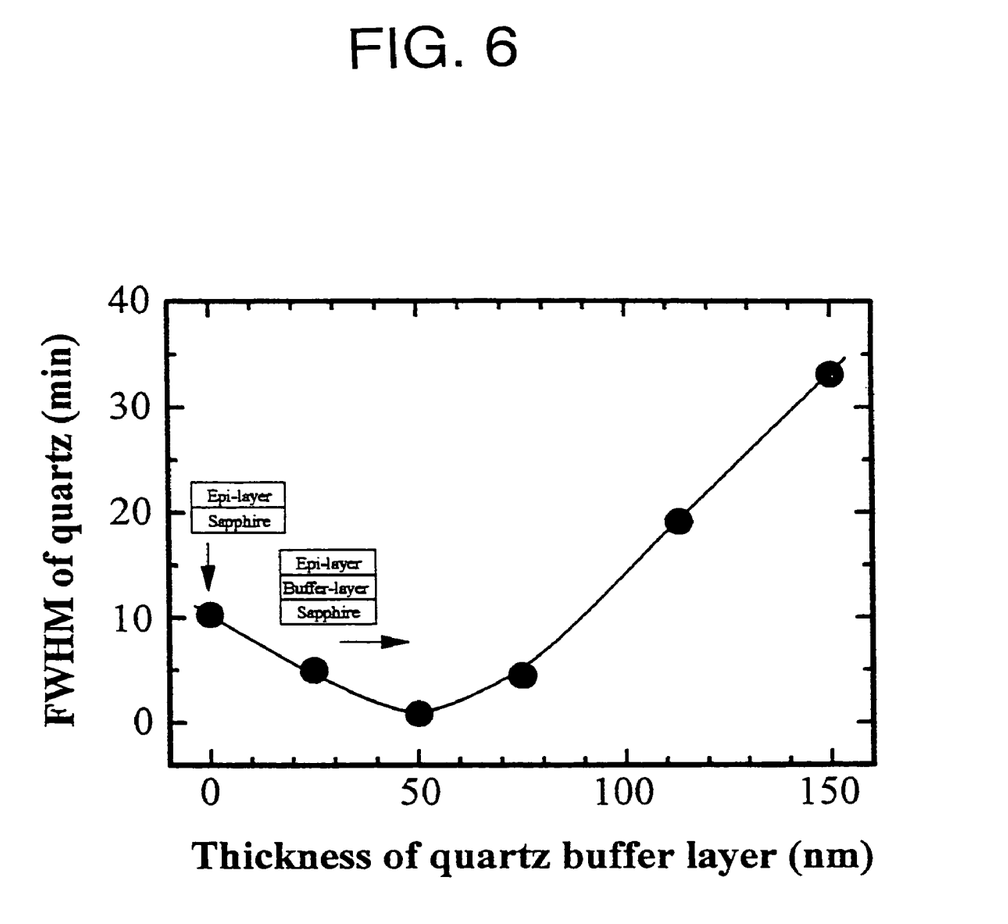
FIG. 6 is a graph showing the relationship between thickness of a buffer layer and a full width at half maximum (FWHM).

Various buffer layers of different thicknesses were formed on the substrate before a quartz epitaxial growth film was formed to determine the effect of the buffer layer. The buffer layer was formed by depositing a quartz at 550° C. and annealing it. A quartz epitaxial film was grown thereon. The quartz epitaxial film was evaluated using the DC-XRD to determine the FWHM. The result is shown in FIG. 6. FIG. 6 shows that the crystalinity of the quartz epitaxial thin film changed depending on the thickness of the buffer layer, and the best crystalinity was obtained when the buffer layer had a thickness of about 25 nm. A quartz thin film having excellent crystalinity absorbed the infrared ray less at a wavenumber of 3585 $cm^{-1}$ indicates the presence of a hydroxyl group (OH group).

According to the present invention, a quartz epitaxial thin film can be provided by a convenient method using a silicon alkoxide such as tetramethoxysilane, tetraethoxysilane, tetrapropoxysilane and tetrabutoxysilane without using a vacuum device. Such a quartz epitaxial thin film is useful for vibrators, oscillators, high frequency filter surface acoustic wave elements, and optical waveguides.

The method for producing the quartz epitaxial thin film of the present invention is an atmospheric pressure vapor phase epitaxial growing method using a silicon alkoxide as a source material. The method of the present invention provides various advantages: (1) the method can be conducted under atmospheric pressure without requiring expensive vacuum device and large-scale equipment, (2) growth rate of a thin film is very high, and production in quantity is possible, (3) no highly purified material is needed, and the thin film can be produced simply and inexpensively, and (4) a thin film with high purity having excellent crystalinity and optical properties can be formed, compared to a conventional laser ablation method or a sputtering method. The method of the present invention is thus highly useful for forming single quartz thin films.

What is claimed is:

1. A method for producing a quartz epitaxial thin film on a substrate, said method comprising:
   providing a substrate;
   forming a buffer layer of GaN or ZnO on the substrate;
   vaporizing, under atmospheric pressure, a source of silicon selected from the group consisting of tetramethoxysilane, tetraethoxysilane, tetrapropoxysilane and tetrabutoxysilane;
   depositing quartz on said buffer layer using a catalyst, which is hydrogen chloride, to promote a reaction of the silicon source with oxygen, thereby forming said quartz epitaxial thin film.

2. The method of claim 1 comprising producing the quartz epitaxial thin film on the substrate or the buffer layer at a rate of about 3 μm per hour.

3. The method of claim 1, wherein the quartz epitaxial thin film consists essentially of quartz.

4. A The method of claim 1, wherein the substrate is sapphire, silicon or GaAs.

5. The method of claim 1, wherein the source of silicon is heated to a temperature of 50° C. to 120° C.

6. The method of claim 1, wherein a temperature of a growth area, for depositing the quartz on the substrate, ranges from 550° C. to 850° C.

7. The method of claim 1, wherein said quartz epitaxial thin film is characterized by an X-ray diffraction profile exhibiting a diffraction peak at $2\theta=50.6°$.

8. The method of claim 1, wherein an inert gas is employed as a carrier gas to introduce said source of silicon into a growth area.

9. The method of claim 1, wherein the oxygen partial pressure is 0.1 to 0.3 atm, in the growth area.

* * * * *